(12) United States Patent
Takai (10) Patent No.: US 10,197,926 B2
(45) Date of Patent: Feb. 5, 2019

(54) EXPOSURE APPARATUS AND METHOD OF MANUFACTURING ARTICLE

(71) Applicant: CANON KABUSHIKI KAISHA, Tokyo (JP)

(72) Inventor: Ryo Takai, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/376,840

(22) Filed: Dec. 13, 2016

(65) Prior Publication Data

US 2017/0184983 A1    Jun. 29, 2017

(30) Foreign Application Priority Data

Dec. 28, 2015    (JP) ................................. 2015-257324

(51) Int. Cl.
*G03B 27/52*    (2006.01)
*G03F 7/20*    (2006.01)

(52) U.S. Cl.
CPC ...... *G03F 7/70883* (2013.01); *G03F 7/70716* (2013.01)

(58) Field of Classification Search
CPC ............. G03F 7/70716; G03F 7/70883; G03F 7/70808; G03F 7/70933
USPC .................................................... 355/30, 72
See application file for complete search history.

(56) References Cited

U.S. PATENT DOCUMENTS

| 5,870,197 | A | * | 2/1999 | Sogard | G03F 7/70716 |
| | | | | | 355/30 |
| 6,731,371 | B1 | * | 5/2004 | Shiraishi | G03B 27/52 |
| | | | | | 250/492.2 |
| 6,765,647 | B1 | * | 7/2004 | Nishi | G03F 7/70808 |
| | | | | | 250/492.2 |
| 6,970,228 | B1 | * | 11/2005 | Aoki | G03F 7/70225 |
| | | | | | 355/30 |

FOREIGN PATENT DOCUMENTS

JP    2004228497 A    8/2004

* cited by examiner

*Primary Examiner* — Peter B Kim
(74) *Attorney, Agent, or Firm* — Rossi, Kimms & McDowell LLP (57) ABSTRACT

The present invention provides an exposure apparatus exposing a substrate through a projection optical system, the apparatus comprising a stage configured to hold the substrate, a detection unit configured to emit detection light in a first direction and detect a position of the stage, a blowing unit configured to blow out a gas, and a guide unit including a first portion and a second portion, wherein the first portion is configured to guide the gas to a first space between the projection optical system and the substrate, such that a gas flow along the substrate is formed in the first space, and wherein the second portion is configured to guide the gas to a second space where the detection light passes through, such that a gas flow in a second direction is formed in the second space.

17 Claims, 7 Drawing Sheets

EXPOSURE APPARATUS AND METHOD OF MANUFACTURING ARTICLE

BACKGROUND OF THE INVENTION

Field of the Invention

The present invention relates to an exposure apparatus, and a method of manufacturing an article.

Description of the Related Art

An exposure apparatus which exposes a substrate is one of apparatuses to be used in the manufacturing step (lithography step) of a semiconductor device or the like. The exposure apparatus can transfer a pattern of a mask to a photosensitive agent (resist) on the substrate by projecting an image of the pattern formed in the mask on the photosensitive agent on the substrate via a projection optical system.

In the exposure apparatus, a gas may be generated from the photosensitive agent on the substrate when the photosensitive agent is exposed. Then, when an optical element (for example, a lens) of the projection optical system is exposed to the gas generated from the photosensitive agent, a decrease in exposure performance such as a decrease in the transmittance of light in the projection optical system or generation of a flare may occur. Further, when the gas generated from the photosensitive agent flows into the optical path of light emitted from a detection unit (for example, a laser interferometer) which detects the position of a substrate stage, a refractive index on the optical path may change, causing an error in a detection result of the position of the substrate stage. As a result, it may become difficult to control the substrate stage accurately. Japanese Patent Laid-Open No. 2004-228497 proposes an exposure apparatus which includes a supply/exhaust unit configured to supply and exhaust an inert gas in a space between a projection optical system and a substrate in order to reduce an influence by a gas generated from a photosensitive agent.

The exposure apparatus can include, for example, a blowing unit (outlet) which blows out a cleaned gas to a chamber which contains the projection optical system and the substrate stage in order to maintain cleanliness inside the chamber. In this case, if the supply/exhaust unit described in Japanese Patent Laid-Open No. 2004-228497 is provided separately from the blowing unit, an apparatus arrangement may become complicated, and an apparatus cost may also increase.

SUMMARY OF THE INVENTION

The present invention provides, for example, an exposure apparatus advantageous in reducing an influence by a gas generated from a photosensitive agent on a substrate.

According to one aspect of the present invention, there is provided an exposure apparatus which exposes a substrate through a projection optical system, the apparatus comprising: a stage configured to hold the substrate and be movable; a detection unit configured to emit detection light in a first direction and detect a position of the stage based on reflected light by the stage; a blowing unit configured to blow out a gas; and a guide unit including a first portion and a second portion, wherein the first portion is configured to guide the gas blown out by the blowing unit, to a first space between the projection optical system and the substrate, such that a gas flow along the substrate is formed in the first space, and wherein the second portion is configured to guide the gas blown out by the blowing unit, to a second space where the detection light passes through, such that a gas flow in a second direction different from the first direction is formed in the second space.

Further features of the present invention will become apparent from the following description of exemplary embodiments with reference to the attached drawings.

DESCRIPTION OF THE EMBODIMENTS

Exemplary embodiments of the present invention will be described below with reference to the accompanying drawings. Note that the same reference numerals denote the same members throughout the drawings, and a repetitive description thereof will not be given.

First Embodiment

Figure 1:
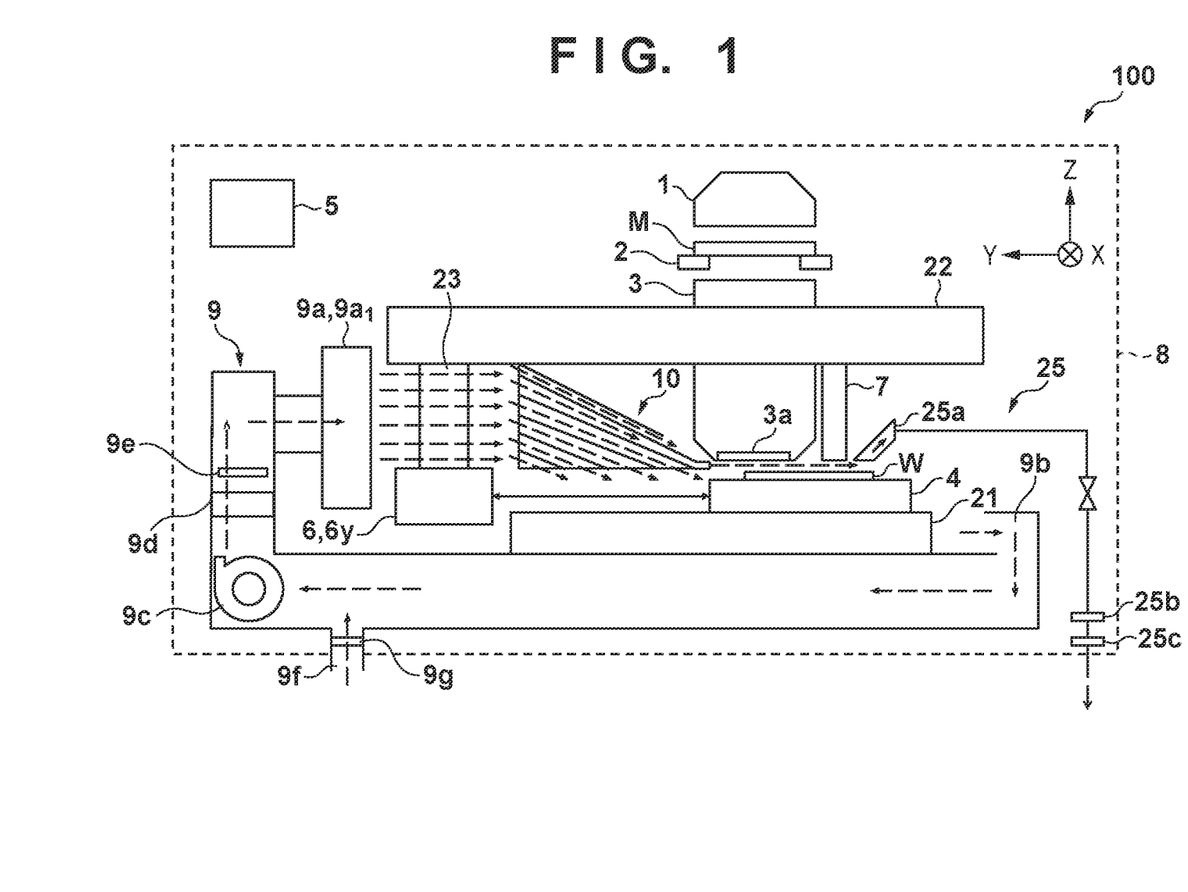
FIG. 1 is a side view showing an exposure apparatus as viewed from an X direction according to the first embodiment.
Figure 2:
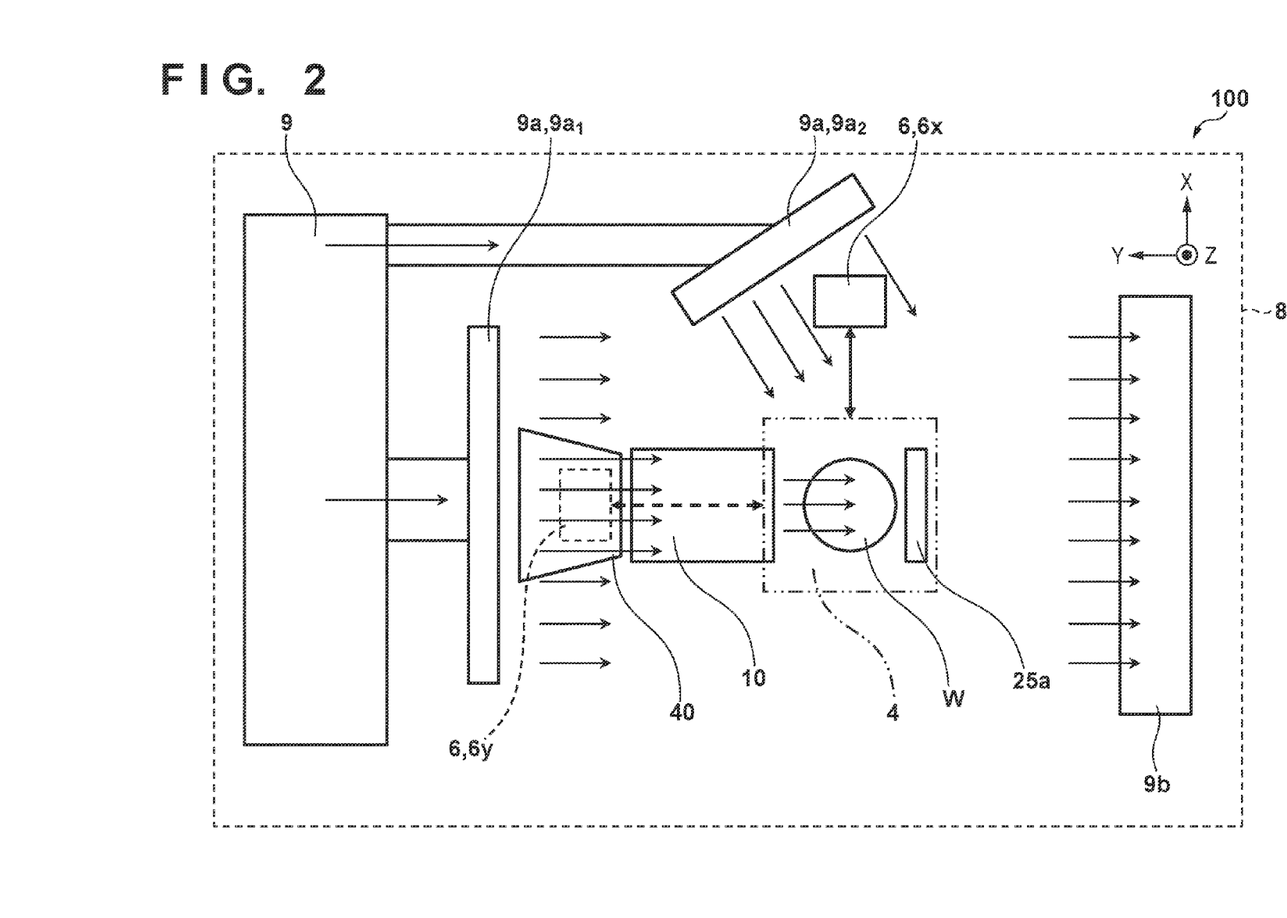
FIG. 2 is a bird's eye view showing the exposure apparatus as viewed from a Z direction according to the first embodiment.

An exposure apparatus 100 according to the first embodiment of the present invention will be described with reference to FIGS. 1 and 2. FIG. 1 is a side view showing the exposure apparatus 100 as viewed from an X direction according to the first embodiment. FIG. 2 is a bird's eye view showing the exposure apparatus 100 as viewed from a Z direction according to the first embodiment. The exposure apparatus 100 can expose a substrate W and include, for example, an illumination optical system 1 which illuminates a mask M, a mask stage 2 that can move while holding the mask M, a projection optical system 3 which projects the pattern of the mask M on the substrate W, a substrate stage 4 that can move while holding the substrate W, and a control unit 5. The substrate stage 4 can be placed on a first base 21. The projection optical system 3 can be supported by a second base 22 facing the first base 21. The control unit 5 is formed by, for example, a computer including a CPU, a memory, and the like, and controls the respective units of the exposure apparatus 100.

The exposure apparatus 100 can also include detection units 6 which detect the position of the substrate stage 4 and a measurement unit 7 which performs alignment measurement of the substrate W. The detection units 6 can include, for example, a Y detection unit 6y and an X detection unit 6x as shown in FIG. 2. The Y detection unit 6y is supported by the second base 22 via a column 23, emits light (detection light) in a −Y direction (the first direction in this embodiment), and detects the position of the substrate stage 4 in a Y direction by reflected light by the substrate stage 4 (the side surface in the Y direction). The X detection unit 6x is supported by the second base 22 via a column (not shown), emits light in a −X direction, and detects the position of the substrate stage 4 in the X direction by light reflected by the substrate stage 4 (the side surface in the X direction). The Y detection unit 6y and the X detection unit 6x can be formed by, for example, laser interferometers. Note that mirrors which reflect light from the detection units 6 (the Y detection unit 6y and the X detection unit 6x) may be provided on the side surfaces (the side surface in the Y direction and the side surface in the X direction) of the substrate stage 4. When a Z detection unit (not shown) detects the height of the substrate stage 4, a mirror may be provided on the substrate holding surface of the substrate stage 4.

The exposure apparatus 100 can further include a chamber 8 which contains at least the projection optical system 3, the substrate stage 4, and the detection units 6 and a blowing unit 9 having outlets 9a each blowing out a gas (for example, air) inside the chamber 8. The blowing unit 9 can include, for example, a absorbing port 9b which absorbs the gas inside the chamber 8, a fan 9c, a filter 9d, and a temperature-regulate heater 9e in addition to the outlets 9a. The fan 9c transmits the gas absorbed from the absorbing port 9b to the filter 9d. The filter 9d is a chemical filter for removing an organic component and an inorganic component in the gas absorbed from the absorbing port 9b. The gas that has passed through the filter 9d undergoes temperature regulation by the temperature-regulate heater 9e, and is then blown out from the outlets 9a to the inside of the chamber 8. The blowing unit 9 of this embodiment includes the outlets 9a (a first outlet $9a_1$ and a second outlet $9a_2$) in two places, as shown in FIG. 2. The gas can be blown out in the nearly horizontal direction from each outlet 9a. Each outlet 9a may include, for example, a ULPA filter or the like. By arranging the blowing unit 9 as described above, it is possible to supply the clean gas from each outlet 9a to the inside of the chamber 8.

In the exposure apparatus 100, a gas may be generated from the photosensitive agent (resist) on the substrate when the photosensitive agent is exposed. Then, when an optical element 3a (for example, an objective lens) of the projection optical system 3 is exposed to the gas generated from the photosensitive agent, a decrease in exposure performance such as a decrease in the transmittance of light in the projection optical system 3 or generation of a flare may occur. Further, when the gas generated from the photosensitive agent flows into the optical path of light emitted from the detection units 6, a refractive index on the optical path may change, causing an error in a detection result of the position of the substrate stage 4. As a result, it may become difficult to control the substrate stage 4 accurately. To cope with this, the exposure apparatus 100 of the first embodiment includes a guide unit 10 which guides the gas blown out from the outlet 9a (first outlet $9a_1$) of the blowing unit 9 to a first space 31 between the projection optical system 3 and the substrate W when the substrate W faces the projection optical system, and a second space 32 where the light from the detection unit 6 (Y detection unit 6y) passes through. That is, the guide unit 10 guides the gas blown out from the outlet 9a to the optical path of the light from the detection unit 6 to the substrate stage 4 and the optical path of the light reflected by the substrate stage 4.

Figure 3:
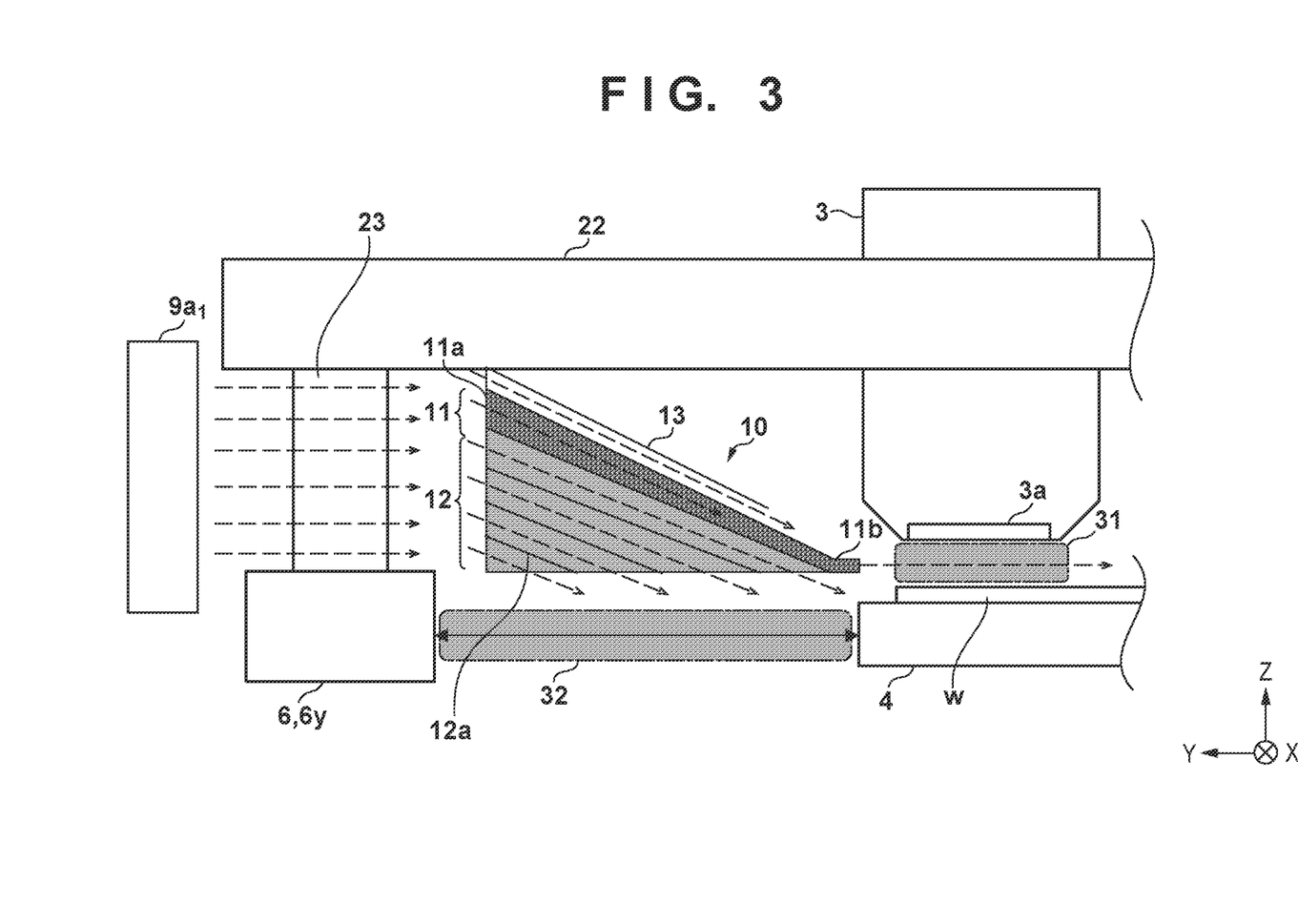
FIG. 3 is a view showing the arrangement of a guide unit.

The arrangement of the guide unit 10 will be described below with reference to FIG. 3. FIG. 3 is an enlarged view showing the arrangement of the guide unit 10 shown in FIG. 1. As shown in FIG. 3, the guide unit 10 includes a first guide portion (first portion) 11 which guides the gas blown out from the first outlet $9a_1$ to the first space 31 and a second guide portion (second portion) 12 which guides the gas blown out from the first outlet $9a_1$ to the second space 32. The guide unit 10 is supported by the second base 22, and is arranged between the first base 21 and the second base 22.

The first guide portion 11 is configured to guide the gas blown out from the first outlet $9a_1$ of the blowing unit 9 to the first space 31 so as to form, in the first space 31, the flow of the gas in a direction along the substrate W (for example, the first direction (−Y direction)). As described above, the first space 31 refers to a space between the projection optical system 3 and the substrate W. The first guide portion 11 can be formed into a tube with a first opening 11a which takes the gas blown out from the first outlet $9a_1$ and a second opening 11b which blows out the gas taken from the first opening 11a. The first guide portion 11 can be formed such that the second opening 11b is smaller than the first opening 11a in size. This makes it possible to make the flow speed of the gas blown out from the second opening 11b of the first guide portion 11 higher than that of the gas blown out from the first outlet $9a_1$ of the blowing unit 9 and remove the gas generated from the photosensitive agent from the first space 31 efficiently. Note that the second opening 11b is preferably set to a size equal to or larger than ⅕ times the size of the first opening 11a. More preferably, the second opening 11b is set to fall within a range of ⅓ to ½ times the size of the first opening 11a. This is because as the size ratio of the second opening 11b to the first opening 11a is lowered, the flow speed of the gas blown out from the second opening 11b can be increased, but the flow speed of the gas is saturated due to the influence of a pressure loss if the ratio becomes lower than a predetermined value.

The second guide portion 12 is configured to guide the gas blown out from the first outlet $9a_1$ of the blowing unit 9 to the second space 32 so as to form, in the second space 32, the flow of the gas in the second direction different from the first direction. More specifically, the second guide portion is configured to guide, to the second space 32, the gas blown out from the first outlet $9a_1$ of the blowing unit 9 from above (on the side of the projection optical system 3 with respect to the optical path of the light emitted from the detection unit 6) the second space 32 by changing the flow direction of the gas. As described above, the second space 32 refers to a space where the light from the detection unit 6 (Y detection unit 6y) passes through. The second guide portion 12 is fixed (attached) to the first guide portion 11 on the lower side (on the side of optical path of the light emitted from the detection unit 6 with respect to the first guide portion 11) of the first guide portion 11.

The second guide portion 12 can include, in a plurality of regions having different positions in the first direction in the second space 32, a plurality of plate members 12a arranged to be spaced apart so as to guide the gas blown out from the first outlet $9a_1$ of the blowing unit 9. By forming the second guide portion 12 so as to include the plurality of plate members 12a as described above, it is possible to supply the gas uniformly to the second space 32 (the optical path of the detection unit) 6. Note that the second guide portion 12 may include side walls (not shown) which sandwich the plurality of plate members 12a in ±X directions such that the gas blown out from the first outlet $9a_1$ is guided to the second space 32 efficiently.

Figure 4A:
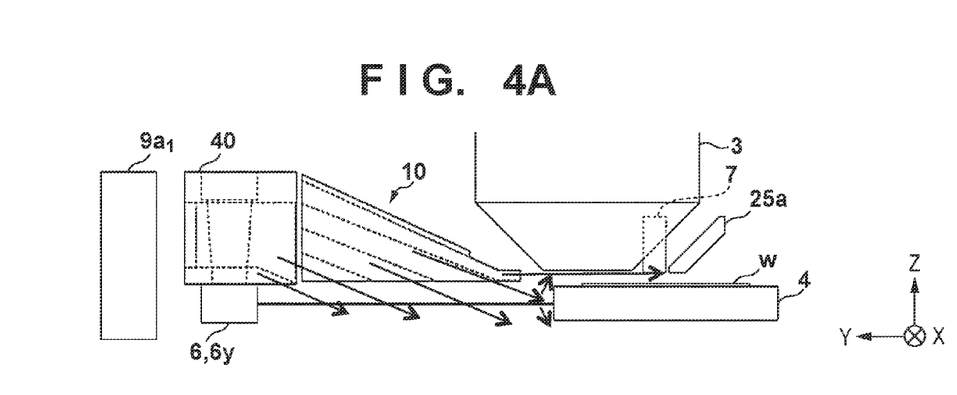
FIG. 4A is a view for explaining the arrangement of the second guide portion in the guide unit.

The second guide portion 12 is preferably formed such that an angle between the second direction and a direction in which the light is emitted from the Y detection unit $6y$ becomes larger than 0° and equal to or smaller than 30°. There is a case in which, for example, the substrate stage 4 moves such that the side surface of the substrate stage 4 in the +Y direction is arranged in the −Y direction as compared with the position of the second opening 11b of the first guide portion 11 when the measurement unit 7 performs alignment measurement of the substrate W or the like. In this case, when the gas from the first guide portion 11 flows into the second space 32, a fluctuation in the gas may occur in the second space 32, and an error may be caused by the fluctuation in the detection result of the Y detection unit $6y$. Therefore, by setting the second direction as described above, it is possible to partially pass the gas blown from the second guide portion 12 onto the side surface of the substrate stage 4 in the +Y direction toward the upward direction, as shown in FIG. 4A. This makes it possible to restrain, by the gas flowing toward the upward direction, the gas blown out from the first guide portion 11 from flowing into the second space 32.

Note that even with the above-described arrangement, the gas from the first guide portion 11 may enter the optical path (second space 32) of the light from the detection unit 6 (Y detection unit $6y$). In this case as well, each of the gas from the first guide portion 11 and the gas from the second guide portion 12 is the gas blown out from the common blowing unit 9, making it possible, in the second space 32, to reduce a change in a refractive index caused by mixing gases different in temperature, pressure, and the like. That is, it is possible to reduce detection errors in the detection unit 6 caused by the change in the refractive index in the optical path. This is particularly effective in a case in which the substrate stage 4 moves from a position directly below the projection optical system 3 to another position.

Figure 4B:
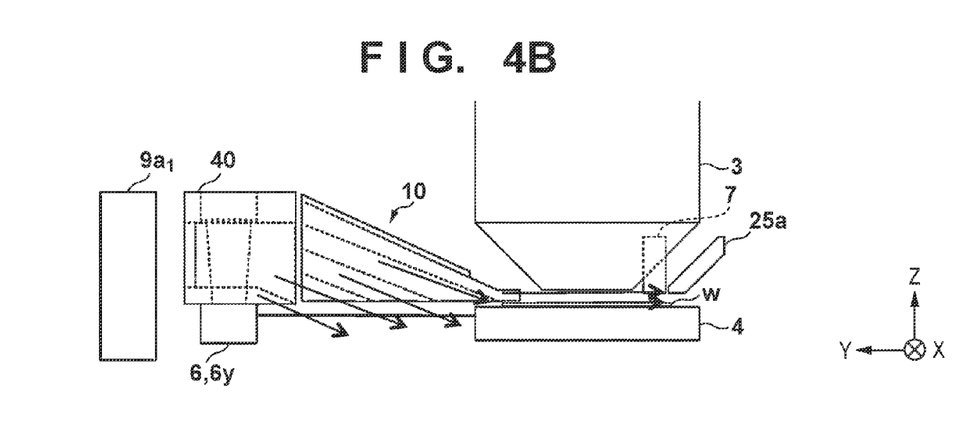
FIG. 4B is a view for explaining the arrangement of the second guide portion in the guide unit.

On the other hand, there is a case in which the side surface of the substrate stage 4 in the +Y direction is arranged in the +Y direction as compared with the position of the second opening 11b of the first guide portion 11. In this case, the gas blown from the second guide portion 12 onto the upper surface of the substrate stage 4 may cause turbulence in the first space 31. Therefore, by setting the second direction as described above, it is possible to pass the gas blown from the second guide portion 12 onto the upper surface of the substrate stage 4 through the first space 31 in the first direction together with the gas from the first guide portion 11, as shown in FIG. 4B. This makes it possible to prevent the turbulence in the first space 31.

Note that a slight heat source may exist in the second base 22 which supports the guide unit 10, and a temperature distribution can be formed in each of the first space 31 and the second space 32 when heat from the second base 22 is transferred to the first guide portion 11 and the second guide portion 12. Therefore, the guide unit 10 may include a third guide portion 13 for passing the gas blown out from the first outlet $9a_1$ of the blowing unit 9 between the second base 22 and the first guide portion 11 along the first guide portion 11. For example, the third guide portion 13 can be arranged between the second base 22 and the first guide portion 11, and configured to cover the first guide portion 11. This makes it easier to reduce heat transfer from the second base 22 to the first guide portion 11, and to control the first space 31 and the second space 32 by the temperature of the gas blown out from the first outlet $9a_1$ (that is, to control them by the temperature-regulate heater 9e).

The third guide portion 13 can be formed such that the position of an opening of the third guide portion 13 which blows out the gas is arranged on the side of the first outlet $9a_1$ as compared with the position of the second opening 11b of the first guide portion 11. This allows the gas blown out from the third guide portion 13 to flow so as to go around the projection optical system 3 without interfering with the gas blown out from the first guide portion 11.

By arranging the guide unit 10 as described above, it is possible to prevent the detection error in the position of the substrate stage 4 and the decrease in the exposure performance caused by the gas generated from the photosensitive agent without newly providing an apparatus which supplies a gas to each of the first space 31 and the second space 32. Each of the gas flowing through the first space 31 and the gas flowing through the second space 32 is the gas blown out from the first outlet $9a_1$ via the same temperature control. Thus, it is also possible to prevent the detection error of the Y detection unit $6y$ caused by mixing gases having different temperatures in the optical path of the light from the Y detection unit $6y$.

Figure 5A:
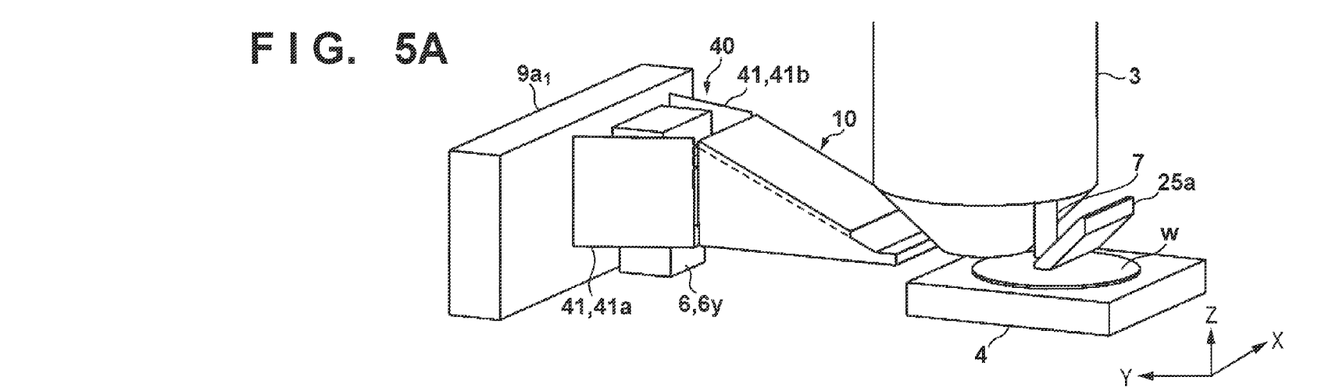
FIG. 5A is a perspective view showing the arrangement of the guide unit and the second guide unit.
Figure 5B:
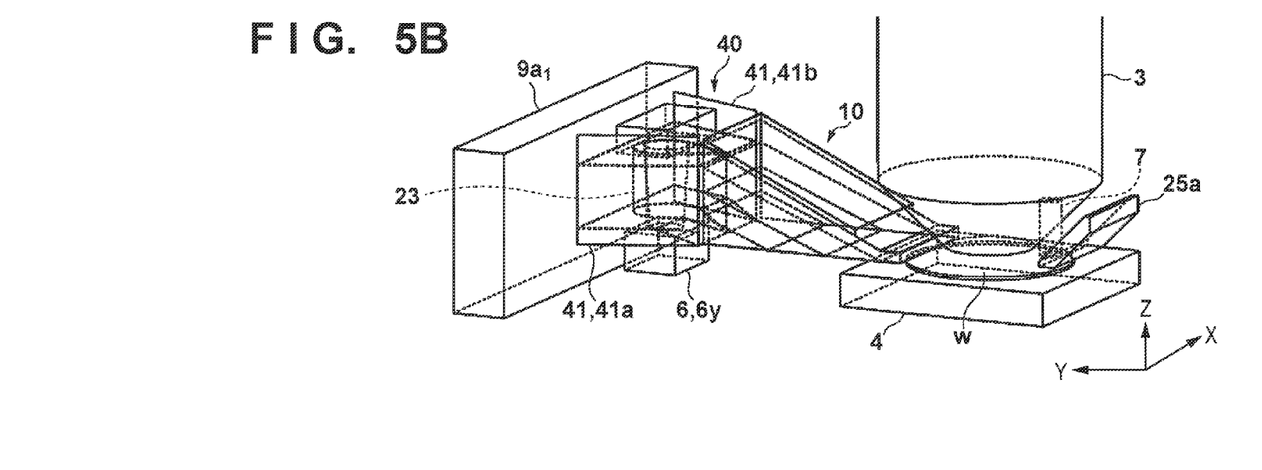
FIG. 5B is a perspective view showing the arrangement of the guide unit and the second guide unit.
Figure 6:
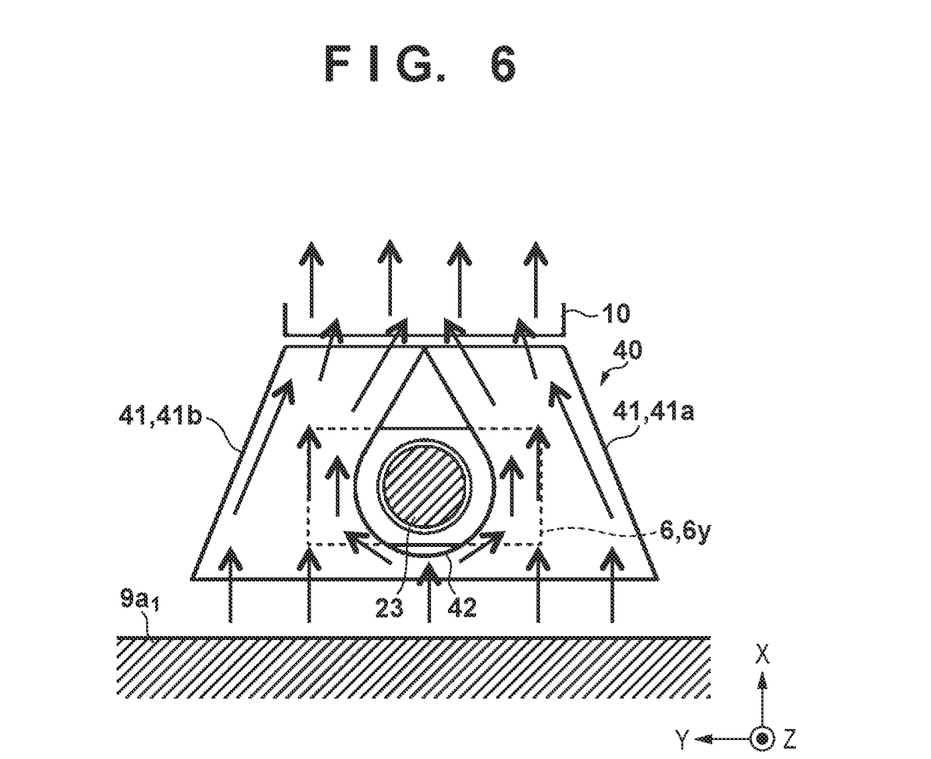
FIG. 6 is a view showing the second guide unit as viewed from the Z direction.

Note that the Y detection unit $6y$ is supported by the second base 22 via the column 23 arranged between the guide unit 10 and the first outlet $9a_1$ of the blowing unit 9. Accordingly, the column 23 may change a direction in which the gas blown out from the first outlet $9a_1$ flows, making it difficult to take the gas blown out from the first outlet $9a_1$ in the guide unit 10 efficiently. It is therefore preferable that the exposure apparatus 100 includes a second guide unit 40 with a plurality of airflow guide plates 41 which sandwich the column 23 such that the gas blown out from the first outlet $9a_1$ goes around the column 23 to be guided to the guide unit 10, as shown in FIGS. 5A and 5B, and 6. In this embodiment, the second guide unit 40 can include two airflow guide plates 41a and 41b. FIG. 5A is a perspective view showing the arrangement of the guide unit 10 and the second guide unit 40. FIG. 5B is a perspective view showing the arrangement of the guide unit 10 and the second guide unit 40. FIG. 6 is a view showing the second guide unit 40 as viewed from the Z direction.

As shown in FIG. 6, two airflow guide plates 41a and 41b in the second guide unit 40 are preferably arranged such that their distance in the X direction becomes shorter as they approach the guide unit 10. That is, two airflow guide plates 41a and 41b are preferably arranged such that the distance in the X direction between their ends on the side of the guide unit 10 is shorter than that on the side of the first outlet $9a_1$. The distance in the X direction between the ends of two airflow guide plates 41a and 41b on the side of the guide unit 10 is preferably almost equal to the width of the guide unit 10 in the X direction. As shown in FIG. 6, it is preferable that the second guide unit 40 includes an airflow guide plate 42 which surrounds the column 23 and is formed into a drop shape as viewed from the Z direction.

Furthermore, it may become difficult, in the exposure apparatus 100, to keep inside the chamber 8 clean if the gas blown out from the first guide portion 11 of the guide unit 10 and flowing through the first space 31 is diffused inside the chamber 8. It is therefore preferable that the exposure apparatus 100 is configured to further include an exhaust unit 25 which exhausts the gas blown out from the first guide portion 11 and flowing through the first space 31. The exhaust unit 25 can include an exhaust port 25a arranged on the side opposite to the first guide portion 11 across the first space 31, a fan 25b for taking a gas from the exhaust port 25a, and a filter 25c for removing an organic component and an inorganic component in the gas taken from the exhaust port 25a. When the exhaust unit 25 is provided as described above, the exposure apparatus 100 may take air (for example, clean dry air (CDA)) outside the exposure apparatus 100 from an intake port 9f of the blowing unit 9 depending on the amount of the gas exhausted by the exhaust unit 25. The intake port 9f can include, for example, a filter 9g.

As described above, the exposure apparatus 100 of the first embodiment includes the guide unit 10 which guides the gas blown out from the outlets 9a of the blowing unit 9 to each of the first space 31 and the second space 32. This allows the exposure apparatus 100 to reduce the influence of the gas generated from the photosensitive agent on the substrate.

Second Embodiment

Figure 7A:
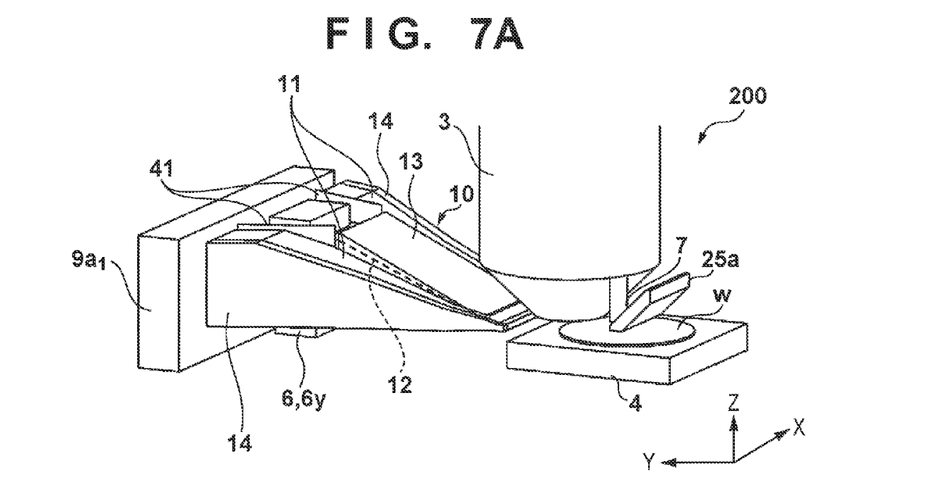
FIG. 7A is a view showing an exposure apparatus according to the second embodiment.
Figure 7B:
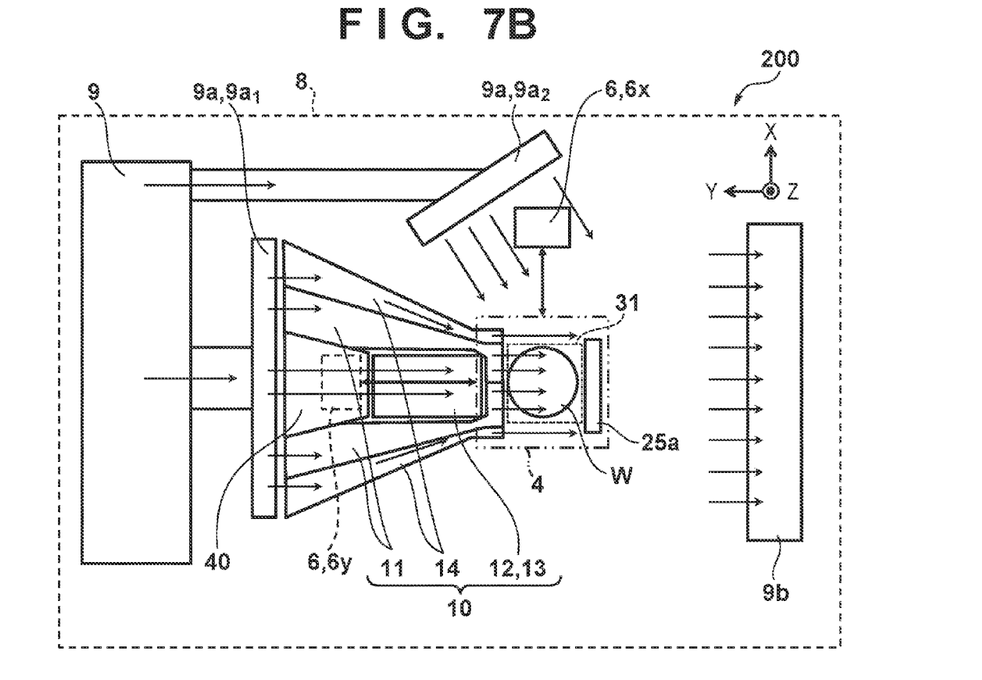
FIG. 7B is a view showing the exposure apparatus according to the second embodiment.

An exposure apparatus 200 according to the second embodiment of the present invention will be described with reference to FIGS. 7A and 7B. FIG. 7A is a perspective view showing the exposure apparatus 200 according to the second embodiment. FIG. 7B is a bird's eye view showing the exposure apparatus 200 as viewed from a Z direction according to the second embodiment. The exposure apparatus 200 of the second embodiment is different from the exposure apparatus 100 of the first embodiment in the arrangement of a guide unit 10. The guide unit 10 in the exposure apparatus 200 of the second embodiment includes two first guide portions 11 arranged so as to sandwich the second guide portion in ±X directions as viewed from the Z direction. Two first guide portions 11 can be formed so as to be connected at an end on the side of a first space 31. In FIGS. 7A and 7B, two first guide portions 11 are partitioned at the end on the side of the first space 31 so as to have structures independent of each other. However, the present invention is not limited to this. For example, they may be formed integrally so as not to include a partition portion.

The guide unit 10 can also include fourth guide portions 14 each guiding a gas blown out from a first outlet $9a_1$ of a blowing unit 9 to a space outside the first space 31 (to be referred to as an outer space hereinafter) so as to form the flow of a gas in the first direction (−Y direction) in the outer space. The outer space refers to a space outside the first space 31 positioned in the X direction on the side of the first space 31 through which the gas blown out from the first guide portion 11 flows. The fourth guide portions 14 can be formed such that the flow speed of the gas in the outer space becomes higher than that in the first space 31. The fourth guide portions 14 can be formed such that, for example, the size ratio of an opening on the side of a projection optical system 3 to an opening on the side of the first outlet $9a_1$ is lower than that of a second opening 11b to a first opening 11a in the first guide portion 11. Accordingly, the gas flowing through the outer space functions as an air curtain. This makes it possible to efficiently exhaust the gas blown out from the first guide portion 11 and flowing through the first space 31 from an exhaust port 25a of an exhaust unit 25, and to prevent the gas blown out from the first guide portion 11 from diffusing outside the first space 31.

Embodiment of Method of Manufacturing Article

A method of manufacturing an article according to an embodiment of the present invention is suitable to manufacture an article, for example, an electronic device such as a semiconductor device or an element having a microstructure. The method of manufacturing the article according to this embodiment includes a step of forming a latent image pattern on a photosensitive agent on a substrate using the above-described exposure apparatus (a step of exposing the substrate), and a step of developing the substrate with the latent image pattern formed in the step. The manufacturing method further includes other known steps (oxidation, deposition, vapor deposition, doping, planarization, etching, resist removal, dicing, bonding, packaging, and the like). The method of manufacturing the article according to this embodiment is superior to a conventional method in at least one of the performance, quality, productivity, and production cost of the article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-257324 filed on Dec. 28, 2015, which is hereby incorporated by reference herein in its entirety.

What is claimed is:

1. An exposure apparatus configured to expose a substrate through a projection optical system arranged in a chamber, the apparatus comprising:
    a stage arranged in the chamber and configured to be movable while holding the substrate;
    a detection unit arranged in the chamber and configured to emit detection light in a first direction and detect a position of the stage based on the detection light reflected by the stage;
    a blowing unit having an outlet which blows out a gas inside the chamber; and
    a guide unit including a first portion and a second portion, wherein the first portion is configured to guide the gas blown out inside the chamber from the outlet of the blowing unit, and flow the gas in a direction along the substrate, toward a first space between the projection optical system and the substrate, such that a gas flow along the substrate is formed in the first space, wherein the second portion is configured to guide the gas blown out inside the chamber from the outlet of the blowing unit, to a second space where the detection light passes through, such that a gas flow in a second direction different from the first direction is formed in the second space, and wherein the guide unit is arranged between the outlet and the projection optical system, to be spaced apart from the outlet without contacting the outlet.

2. The apparatus according to claim 1, further comprising a first base on which the stage is placed, and a second base facing the first base and configured to support the projection optical system, wherein the guide unit is supported by the second base, and is arranged between the first base and the second base.

3. The apparatus according to claim 2, wherein the guide unit further includes a third portion configured to guide the gas blown out inside the chamber from the outlet of the blowing unit, between the second base and the first portion, along the first portion.

4. The apparatus according to claim 3, wherein the detection unit is supported by the second base via a column arranged between the outlet of the blowing unit and the guide unit, and the exposure apparatus includes a plurality of airflow guide plates configured to sandwich the column such that the gas blown out inside the chamber from the outlet of the blowing unit is guided to the guide unit by going around the column.

5. The apparatus according to claim 1, wherein the second portion includes a plurality of plate members arranged to be spaced apart so as to guide the gas to a plurality of regions in the second space, the plurality of regions having different positions from each other in the first direction.

6. The apparatus according to claim 1, wherein an angle between the first direction and the second direction is larger than 0° and not more than 30°.

7. The apparatus according to claim 1, wherein the second portion is fixed to a lower side of the first portion.

8. The apparatus according to claim 1, wherein the first portion includes a first opening configured to take the gas blown out inside the chamber from the outlet of the blowing unit, and a second opening configured to discharge, to the first space, the gas taken from the first opening, and the second opening is smaller than the first opening.

9. The apparatus according to claim 8, wherein the second opening has a size equal to or larger than ⅕ times a size of the first opening.

10. The apparatus according to claim 1, wherein the guide unit includes a fourth portion configured to guide the gas blown out inside the chamber from the outlet of the blowing unit, to an outside space of the first space, such that a gas flow in a direction parallel to the gas flow of the first space is formed in the outside space.

11. The apparatus according to claim 1, further comprising an exhaust unit configured to exhaust the gas which is guided by the first portion and is flowed through the first space.

12. The apparatus according to claim 1, wherein the second portion is configured to guide the gas blown out inside the chamber from the outlet of the blowing unit, such that the gas is supplied from a region above the second space to the second space.

13. The apparatus according to claim 12, wherein the second space is arranged below a region between the projection optical system and the blowing unit.

14. The apparatus according to claim 1, wherein the first portion and the second portion are arranged above the second space.

15. The apparatus according to claim 1, wherein the blowing unit further has a recovery port which recovers a gas inside the chamber, and is configured to blow out the gas recovered by the recovery port, inside the chamber from the outlet.

16. A method of manufacturing an article, the method comprising:

exposing a substrate using an exposure apparatus;

developing the exposed substrate; and processing the developed substrate to manufacture the article, wherein the exposure apparatus exposes a substrate through a projection optical system arranged in a chamber, and includes:

a stage arranged in the chamber and configured to be movable while holding the substrate;

a detection unit arranged in the chamber and configured to emit detection light in a first direction and detect a position of the stage based on the detection light reflected by the stage;

a blowing unit having an outlet which blows out a gas inside the chamber; and a guide unit including a first portion and a second portion, wherein the first portion is configured to guide the gas blown out inside the chamber from the outlet of the blowing unit, and flow the gas in a direction along the substrate, toward a first space between the projection optical system and the substrate, such that a gas flow along the substrate is formed in the first space, wherein the second portion is configured to guide the gas blown out inside the chamber from the outlet of the blowing unit, to a second space where the detection light passes through, such that a gas flow in a second direction different from the first direction is formed in the second space, and wherein the guide unit is arranged between the outlet and the projection optical system, to be spaced apart from the outlet without contacting the outlet.

17. An exposure apparatus configured to expose a substrate through a projection optical system, the apparatus comprising:

a stage configured to hold the substrate and be movable;

a detection unit configured to emit detection light in a first direction and detect a position of the stage based on the detection light reflected by the stage;

a blowing unit configured to blow out a gas; and a guide unit including a first portion and a second portion, wherein the first portion is configured to guide the gas blown out by the blowing unit, to a first space between the projection optical system and the substrate, such that a gas flow along the substrate is formed in the first space, wherein the second portion is configured to guide the gas blown out by the blowing unit, to a second space where the detection light passes through, such that a gas flow in a second direction different from the first direction is formed in the second space, and wherein the second portion includes a plurality of plate members arranged to be spaced apart so as to guide the gas to a plurality of regions in the second space, the plurality of regions having different positions from each other in the first direction.

\* \* \* \* \*